United States Patent
Mizugaki et al.

(10) Patent No.: US 6,603,701 B2
(45) Date of Patent: Aug. 5, 2003

(54) SEMICONDUCTOR MEMORY APPARATUS HAVING CELL BLOCKS AND COLUMN DRIVERS WITH A COLUMN ADDRESS DECODING MODULE AND A COLUMN DRIVE ENABLE SIGNAL GENERATION MODULE ARRANGED TO EFFECTIVELY REDUCE CHIP SIZE

(75) Inventors: Koichi Mizugaki, Suwa (JP); Eitaro Otsuka, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/108,399

(22) Filed: Mar. 29, 2002

(65) Prior Publication Data

US 2002/0154557 A1 Oct. 24, 2002

(30) Foreign Application Priority Data

Apr. 5, 2001 (JP) ........................................ 2001-106617

(51) Int. Cl.⁷ ................................................ G11C 8/00
(52) U.S. Cl. ............................. 365/230.03; 365/230.06; 365/208; 365/185.11; 365/185.21
(58) Field of Search ..................... 365/230.03, 230.06, 365/208, 185.11, 185.21

(56) References Cited

U.S. PATENT DOCUMENTS

| | | | |
|---|---|---|---|
| 4,700,328 A | * | 10/1987 | Burghard ..................... 365/51 |
| 4,933,907 A | * | 6/1990 | Kumanoya et al. ......... 365/222 |
| 6,385,121 B2 | * | 5/2002 | Lee ....................... 365/230.03 |

* cited by examiner

Primary Examiner—Hoai Ho
Assistant Examiner—Connie C. Yoha
(74) Attorney, Agent, or Firm—Oliff & Berridge, PLC

(57) ABSTRACT

A semiconductor memory device including a first memory cell block and a second memory cell block, both cell blocks having memory cells arranged in a matrix, and a common preamplifier/write driver located between and shared by the first memory cell block and the second memory cell block. The first memory cell block and the second memory cell block are aligned in a direction parallel to columns of the memory cells.

2 Claims, 7 Drawing Sheets

Fig. 1

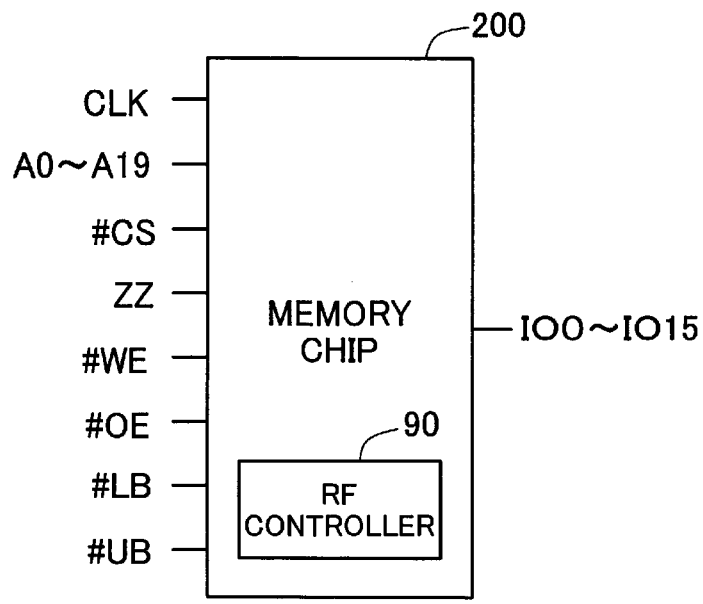

Fig. 2

|  | #CS | ZZ | Refresh Mode (Notes) |
|---|---|---|---|
| Operations | L | H | Mode 1 |
| Standby | H | H | Mode 1 |
| Snooze (Power Down) | H | L | Mode 2 |

(Notes)
Refresh mode 1: Refreshing is carried out synchronously with the clock signal CLK after generation of a refresh timing signal in the memory chip.
Refresh mode 2: Refreshing is carried out in response to generation of the refresh timing signal in the memory chip (the clock signal CLK is not required).

SEMICONDUCTOR MEMORY APPARATUS HAVING CELL BLOCKS AND COLUMN DRIVERS WITH A COLUMN ADDRESS DECODING MODULE AND A COLUMN DRIVE ENABLE SIGNAL GENERATION MODULE ARRANGED TO EFFECTIVELY REDUCE CHIP SIZE

BACKGROUND OF THE INVENTION

1. Field of the Invention

The present invention relates to chip size reduction of a semiconductor memory device.

2. Description of the Related Art

A DRAM and an SRAM are typically used as the semiconductor memory device. As is well known in the art, the DRAM is less expensive and has a larger capacity than the SRAM, but requires the refreshing operation. On the other hand, the SRAM is convenient without any requirement of the refreshing operation, but is more expensive and has a smaller capacity than the DRAM.

A virtual SRAM (referred to as VSRAM or PSRAM) is known as a semiconductor memory device having the advantages of both the DRAM and the SRAM. The virtual SRAM has a memory cell array of dynamic memory cells like the DRAM and includes a refresh controller for execution of the refreshing operation. An external device (for example, a CPU) connecting with the virtual SRAM can thus gain access to the virtual SRAM (for reading and writing data) without specifically being aware of the refreshing operation.

The size of the semiconductor chip is expanded with an increase in storage capacity of the virtual SRAM. The large chip size tends to extend the length of the internal connection line, which may cause deterioration of the operating performance, such as the lowered operating speed, due to a signal delay. It is accordingly desired to attain chip size reduction even in the case of the increased storage capacity.

The requirement of chip size reduction is not restricted to the virtual SRAM but is common to a diversity of semiconductor memory devices like the DRAM and the SRAM.

SUMMARY OF THE INVENTION

The object of the present invention is thus to solve the problems discussed above and to provide a technique of attaining chip size reduction of a semiconductor memory device, such as a virtual SRAM.

In order to attain at least part of the above and the other related objects, the present invention is directed to a first semiconductor memory device including: a first memory cell block and a second memory cell block, in each of which memory cells are arranged in a matrix; and a common preamplifier/write driver shared by the first memory cell block and the second memory cell block. The first memory cell block and the second memory cell block are aligned in a direction parallel to columns of the memory cells. The common preamplifier/write driver is located between the first memory cell block and the second memory cell block.

This semiconductor memory device has one common preamplifier/write driver shared by the first memory cell block and the second memory cell block. The common preamplifier/write driver, the first memory cell block, and the second memory cell block are arranged in the direction parallel to the columns of the memory cells. In the case of no sharing of the preamplifier/write driver, two preamplifier/write drivers are provided in the direction parallel to the columns of the memory cells. The arrangement of the first semiconductor device of the present invention thus effectively attains size reduction of the semiconductor chip in the direction parallel to the columns of the memory cells.

When the common preamplifier/write driver is not disposed between the first memory cell block and the second memory cell block but is located on an outer end of either of the two memory cell blocks in the direction parallel to the columns of the memory cells, there is a relatively large difference between the length of a connection line of the common preamplifier/write driver with one memory cell block and the length of a connection line of the common preamplifier/write driver with the other memory cell block. In the semiconductor device of the present invention, however, the common preamplifier/write driver is located between the two memory cell blocks. Compared with the structure where the common preamplifier/write driver is located on the outer end of either of the two memory cell blocks, there is a significantly smaller difference between the length of the connection line of the common preamplifier/write driver with one memory cell block and the length of the connection line of the common preamplifier/write driver with the other memory cell block. This arrangement desirably prevents deterioration of the operating performance, due to a signal delay according to the varied length of the connection line.

In accordance with one preferable application, the first semiconductor memory device further has multiple bit line pairs connecting the first memory cell block with the second memory cell block. The common preamplifier/write driver includes: a preamplifier circuit and a write driver circuit that are provided on each of the bit line pairs and are connected in parallel to the bit line pair; a first switch that is disposed between the first memory cell block and contacts of the preamplifier circuit and the write driver circuit with the bit line pair, in order to connect the preamplifier circuit and the write driver circuit with the first memory cell block; and a second switch that is disposed between the second memory cell block and the contacts, in order to connect the preamplifier circuit and the write driver circuit with the second memory cell block. The first switch and the second switch are controlled respectively in response to a first block selection signal and a second block selection signal, which respectively correspond to the first memory cell block and the second memory cell block.

This readily actualizes the common preamplifier/write driver.

In accordance with another preferable application, the first semiconductor memory device further has a common column address decoder shared by the first memory cell block and the second memory cell block. The common column address decoder is located adjacent to the common preamplifier/write driver between the first memory cell block and the second memory cell block.

In this application, the common column address decoder shared by the first memory cell block and the second memory cell block is located adjacent to the common preamplifier/write driver between the first memory cell block and the second memory cell block. This arrangement attains further reduction of the chip size in the direction parallel to the columns of the memory cells.

Compared with the structure where the common column address decoder is not disposed between the first memory cell block and the second memory cell block but is located on the outer end of either of the two memory cell blocks in the direction parallel to the columns of the memory cells, there is a significantly smaller difference between the length of the connection line of the common column address decoder with the first memory cell block and the length of the connection line of the common column address decoder with the second memory cell block. This arrangement desirably prevents deterioration of the operating performance, due to a signal delay according to the varied length of the connection line.

The present invention is also directed to a second semiconductor memory device including: a first memory cell block and a second memory cell block, in each of which memory cells are arranged in a matrix; and a common column address decoder shared by the first memory cell block and the second memory cell block. The first memory cell block and the second memory cell block are aligned in a direction parallel to columns of the memory cell. The common column address decoder is located between the first memory cell block and the second memory cell block.

In this semiconductor memory device, the common column address decoder shared by the first and the second memory cell blocks is located between the first memory cell block and the second memory cell block, which are aligned in the direction parallel to the columns of the memory cells. Like the first semiconductor memory device, this arrangement desirably attains reduction of the chip size in the direction parallel to the columns of the memory cells.

Compared with the structure where the common column address decoder is not disposed between the first memory cell block and the second memory cell block but is located on the outer end of either of the two memory cell blocks in the direction parallel to the columns of the memory cells, there is a significantly smaller difference between the length of the connection line of the common column address decoder with the first memory cell block and the length of the connection line of the common column address decoder with the second memory cell block. This arrangement desirably prevents deterioration of the operating performance, due to a signal delay according to the varied length of the connection line.

In one preferable embodiment of both the first semiconductor memory device and the second semiconductor memory device, the first memory cell block and the second memory cell block respectively have a first column driver and a second column driver disposed on either side of the common column address decoder. The common column address decoder has: a column address decoding module that supplies a set of column selection signals, which are converted corresponding to an input column address, commonly to the first column driver and the second column driver; and a column drive enable signal generation module that supplies a first column drive enable signal and a second column drive enable signal respectively to the first column driver and the second column driver, in order to enable operations of the first column driver and the second column driver.

This arrangement readily actualizes the common column decoder.

BRIEF DESCRIPTION OF THE DRAWINGS

FIG. 1 illustrates the terminal structure of a memory chip 200 in one embodiment of the present invention;

FIG. 2 shows a division of the operating state of the memory chip 200 according to the signal levels of a chip select signal #CS and a snooze signal ZZ;

DESCRIPTION OF THE PREFERRED EMBODIMENTS

Figure 3:
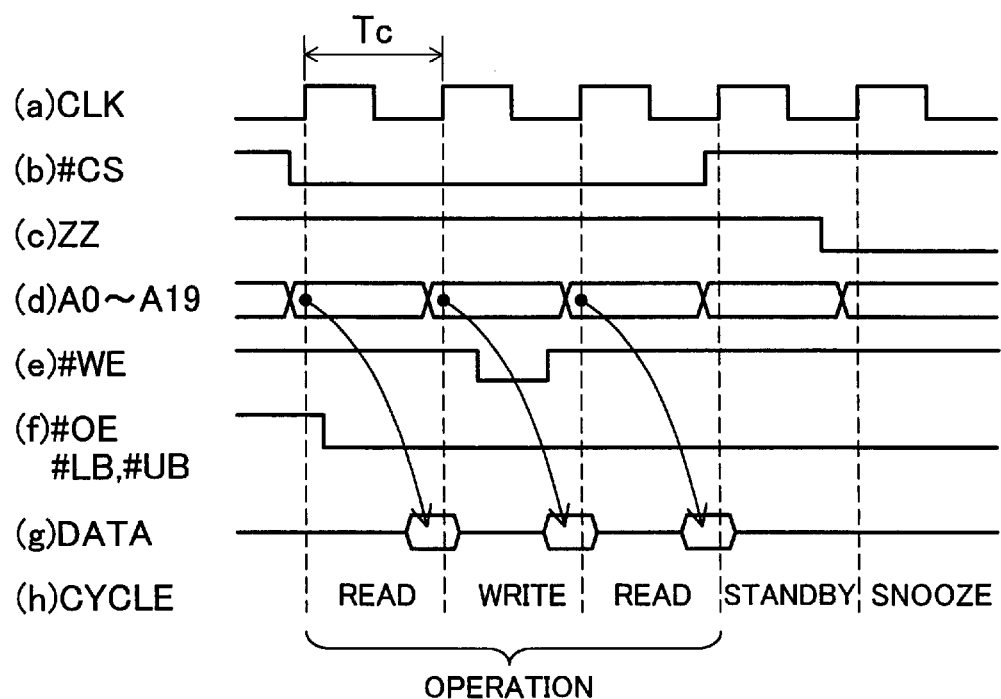
FIG. 3 is a timing chart showing the operations of the memory chip 200.

One mode of carrying out the present invention is discussed below as a preferred embodiment in the following sequence:

A. Terminal Structure of Memory Chip and Outline of Operating State
B. General Construction of Memory Chip
C. General Layout in Memory Chip
D. Structure of Common Column Decoder
E. Structure of Common Preamplifier/write Driver
F. Modifications A. Terminal Structure of Memory Chip and Outline of Operating State FIG. 1 illustrates the terminal structure of a memory chip 200 in one embodiment of the present invention. The memory chip 200 has the following terminals:

CLK: clock input terminal

A0 to A19: (20) address input terminals

CS: chip select input terminal

ZZ: snooze input terminal

WE: write enable input terminal

OE: output enable input terminal (output permission signal input terminal)

LE: lower byte enable input terminal

UB: upper byte enable input terminal

IO0 to IO15: (16) input-output data terminals

In the following explanation, an identical symbol is assigned to both the terminal name and the signal name. The prefix '#' attached to the terminal name (signal name) represents a negative logic. Although there are actually multiple address input terminals A0 through A19 and input-output data terminals IO0 through IO15, the illustration of FIG. 1 is simplified.

The memory chip 200 is constructed as a virtual SRAM (VSRAM) accessible according to a similar protocol to that for an SRAM. Unlike the SRAM, however, the memory chip 200 utilizes a DRAM having a dynamic type memory cell and thus requires refreshing in a preset time period. The memory chip 200 accordingly has a built-in refresh controller 90. In the specification hereof, data reading and writing operations by an external device (control device) are referred to as 'external access', whereas refreshing operations by the built-in refresh (RF) controller 90 are referred to as 'internal refresh' or 'refresh'.

The clock signal CLK is used as a synchronizing signal for synchronization with start of external access and with start of internal refresh. Namely the address signals A0 through A19 and the chip select signal #CS are input from an external device synchronously with the clock signal CLK. The internal refresh is generally carried out synchronously with this clock signal CLK. The built-in refresh controller 90 adjusts the external access and the internal refresh in synchronism with this clock signal CLK.

In the specification hereof, the expression of 'a certain signal is synchronous with the clock signal CLK' is not restricted to generation of the certain signal at the same time as an edge of the clock signal CLK, but means that the certain signal is generated with a fixed time relation to the edge of the clock signal CLK.

The chip select signal #CS and the snooze signal ZZ shown in FIG. 1 function to control the operating state of the memory chip 200. FIG. 2 shows a division of the operating state of the memory chip 200 according to the signal levels of the chip select signal #CS and the snooze signal ZZ. In the specification hereof, the 'level H' represents the level '1' out of two levels of a binary signal and the 'level L' represents the level '0'.

When the chip select signal #CS is at the level L (active) and the snooze signal ZZ is at the level H, a read/write operation cycle (hereinafter may be referred to as 'operation cycle' or 'read/write cycle) is activated. The operation cycle allows execution of the external access and occasional execution of the internal refresh.

When both the chip select signal #CS and the snooze signal ZZ are at the level H, a standby cycle is activated. The standby cycle forbids execution of the external access and keeps all word lines in an inactive state. While the internal refresh is carried out, however, only word lines specified by a refresh address are activated.

When the chip select signal #CS is the level H (inactive) and the snooze signal ZZ is at the level L, the memory chip 200 shifts to a snooze state (also referred to as 'power down state'). In the snooze state, circuit elements other than those required for the refreshing operation are ceased. The snooze state consumes extremely little power and is thus suitable for backup of data in the memory The refreshing operation is carried out according to a first refresh mode in the operation cycle and the standby cycle, but according to a second refresh mode in the snooze state. The first refresh mode starts the refreshing operation synchronously with the clock signal CLK after generation of a refresh timing signal. The second refresh mode, on the other hand, starts the refreshing operation immediately after generation of the refresh timing signal. In the second refresh mode, the refreshing operation is not synchronous with the clock signal CLK, and the clock signal CLK is not required. Namely the memory chip 200 carries out the refreshing operation according to the refresh mode corresponding to each of the three operating states.

The signals other than these three signals CLK, #CS, and ZZ are substantially identical with those used for general memory chips. The address data A0 through A19 shown in FIG. 1 have 20 bits and specify an address of 1 mega word. The input-output data IO0 through IO15 are 16-bit data corresponding to 1 word. Namely one value of the address data A0 through A19 corresponds to 16 bits (1 word), and the 16-bit input-output data IO0 through IO15 may be input or output at once.

In the operation cycle, a write cycle is executed at the level L of the write enable signal #WE, whereas a read cycle is executed at the level H of the write enable signal #WE. Output from the input-output data terminals IO0 through IO15 is enabled at the level L of the output enable signal #OE. The lower byte enable signal #LB and the upper byte enable signal #UB are control signals to allow reading or writing with regard to only 1 byte of either the lower byte or the upper byte in 1 word (16 bits). For example, when the lower byte enable signal #LB is set at the level L and the upper byte enable signal #UB is set at the level H, reading or writing is carried out with regard to only the lower 8 bits in 1 word. A power terminal is omitted from the illustration of FIG. 1.

FIG. 3 is a timing chart showing the operations of the memory chip 200. The current state among the three operating states shown in FIG. 2 (operation, standby, snooze) is occasionally determined according to the variations of the chip select signal #CS and the snooze signal ZZ. First three cycles in FIG. 3 are in the operation cycle. The operation cycle executes either a reading operation (read cycle) or a writing operation (write cycle) in response to the level of the write enable signal #WE. A shortest period Tc of an ATD signal (that is, the shortest period of the variation of the address data A0 through A19) corresponds to a cycle time (also referred to as 'cycle period') of this memory chip 200. The cycle time Tc is set in a range of about 50 ns to about 100 ns, for example, in the case of random access.

In a fourth cycle of FIG. 3, since the chip select signal #CS has risen to the level H, the standby cycle starts. In a fifth cycle, since the snooze signal ZZ has fallen to the level L, the memory chip 200 falls into the snooze state.

Among the signals shown in FIG. 13, the chip select signal #CS and the address data A0 through A1 are input from an external device (for example, a CPU) synchronously with the clock signal CLK. More specifically, the chip select signal #CS and the address data A0 through A19 are input into the memory chip 200 earlier by a preset time (setup time) than a rising edge of the clock signal CLK. This makes the values of these signals #CS and A0 through A19 specified at the rising edge of the clock signal CLK.

B. General Construction of Memory Chip

Figure 4:
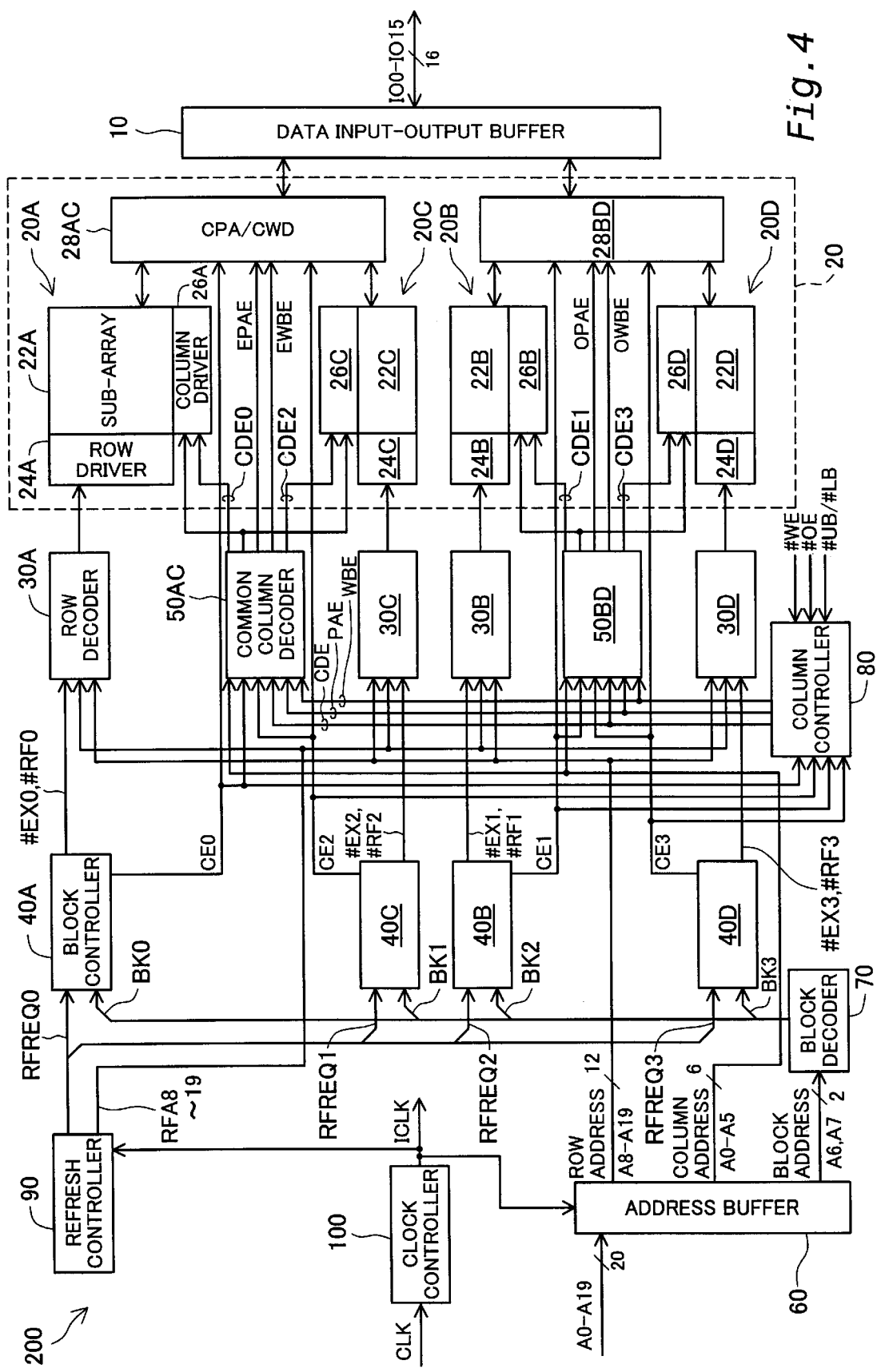
FIG. 4 is a block diagram showing the internal structure of the memory chip 200.

FIG. 4 is a block diagram illustrating the internal structure of the memory chip 200. This memory chip 200 has a data input-output buffer 10, a memory cell array 20, and an address buffer 60.

The memory cell array 20 is divided into four blocks 20A through 20D. The last letters A through D of the symbols 20A through 20D assigned to the respective blocks correspond to block numbers 0 through 3, any of which is selected in response to the value of a block address A6 and A7 described later. The first block 20A has a memory cell sub-array 22A, a row driver 24A, and a column driver 26A. Each of the other blocks 20B through 20D has identical elements.

A first common preamplifier/write driver (CPA/CWD) 28AC allows transmission of data between the sub-array 22A of the first block 20A or a sub-array 22C of the third block 20C and the data input-output buffer 10. A second common preamplifier/write driver (CPA/CWD) 20BD allows transmission of data between a sub-array 22B of the second block 20B or a sub-array 22D of the fourth block 20D and the data input-output buffer 10. Each of the sub-arrays 22A through 22D is provided with a pre-charge circuit and a sense amplifier (not shown).

The respective blocks 20A through 20D have a substantially identical structure. The following thus mainly describes the first block 20A and the other circuits related thereto.

Each block 20A has practically the same structure as that of the memory cell array of a typical DRAM. The sub-array 22A has a plurality of 1-transistor 1-capacitor type memory cells arranged in a matrix. A word line and a bit line pair (also referred to as data line pair) are connected to each of the memory cells. The row driver 24A selects one of multiple word lines in the sub-array 22A in response to a word line selection signal supplied from a row decoder 30A and activates the selected word line. The column driver 26A simultaneously selects bit line pairs for 1 word (16 bits) among multiple bit line pairs in the sub-array 22A, in response to a bit line selection signal supplied from a common column decoder 50AC described later. The external device accordingly gains simultaneous access to 16-bit (1-word) data in one block by simply inputting one value of the address data A0 through A19.

The address buffer 60 shown on the lower left corner of FIG. 4 receives the input of the 20-bit address data A0 through 19. The address data A0 through A19 are latched in the address buffer 60 synchronously with the clock signal CLK and are supplied to other circuits. The lower-most 6-bit address data A0 through A5 specify a column address, and the upper-most 12-bit address data A8 through A19 specify a row address. The 2-bit address data A6 and A7 between the row address and the column address specify a block address for selecting one of the four blocks 20A through 20D. Namely the block address A6 and A7 selects one among the four blocks 20A through 20D, and the combination of the column address A0 through A5 with the row address A8 through A19 selects 1-word (16-bit) data out of the selected block. The selected 1-word data is read or written via the data input-output buffer 10. The row address, the column address, and the block address are not restricted to the above combination, but the 20-bit input address data A0 through A19 may be divided into a 12-bit row address, a 6-bit column address, and a 2-bit block address.

The block address A6 and A7 is input into a block decoder 70, which outputs one of block selection signals BK0 through BK3 in response to the value of the input block address A6 and A7. For example, when one block selection signal BK0 is set active (at the level H), external access is required for the corresponding block 20A. The block address A6 and A7 selects one among the four blocks 20A through 20D, and the combination of the column address A0 through A5 with the row address A8 through A19 selects 1-word (16-bit) data out of the selected block. The selected 1-word data is read or written via the data input-output buffer 10.

Row decoders 30A through 30D and block controllers 40A through 40D are connected to the respective blocks 20A through 20D in this order. A first common row decoder 50AC is connected to the first block 20A and the third block 20C, whereas a second common row decoder 50BD is connected to the second block 20B and the fourth bock 20D. The two common row decoders 50AC and 50BD are connected to a column controller 80.

A refresh controller 90 and a clock controller 100 are further included in the memory chip 200.

The refresh controller 90 of FIG. 4 controls the refreshing operations of the respective blocks 20A through 20D, in response to a refresh timing signal generated by a built-in refresh timer.

The block controllers 40A through 40D receive refresh requirement signals RFREQ0 through RFREQ3, in addition to the block selection signals BK0 through BK3. The refresh requirement signals RFREQ0 through RFREQ3 request start of the refreshing operations in the corresponding four blocks 20A through 20D. The block controllers 40A through 40D adjust external access and internal refresh with regard to the four blocks 20A through 20D, in response to these signals BK0 through BK3 and RFREQ0 through RFREQ3. The adjustment is performed by setting output levels of external address execution signals #EX0 through #EX3 and refresh execution signals #RF0 through #RF3 to the four blocks 20A through 20D. The block controllers 40A through 40D respectively output column access enable signals CE0 through CE3, in response to the block selection signals BK0 through BK3. The external access execution signals #EX0 through #EX3 also function as row access enable signals.

The row decoders 30A through 30D respectively select either of the row address A8 through A19 supplied from the external device or a refresh address RFA8 through RFA19 supplied from the refresh controller 90 in response to the levels of the external access execution signals #EX0 through #EX3 and the refresh execution signals #RF0 through #RF3, and supply a word line selection signal corresponding to the selected address to the corresponding column drivers 24A through 24D.

The column controller 80 supplies a column decode enable signal CDE, a preamplifier enable signal PAE, and a write buffer enable signal WBE to each of the common column decoders 50AC and 50BD, in response to the column access enable signals CE0 through CE3 and the various enable signals #WE, #OE, #LB, and #UB. The column decode enable signal CDE represents a timing of permission for the selecting operation of bit line pairs. The preamplifier enable signal PAE represents a timing of permission for the reading operation with the pre-amplifier. The write buffer enable signal WBE represents a timing of permission for the writing operation with the write driver.

The first common column decoder 50AC supplies a bit line selection signal (column selection signal) corresponding to the column address A0 through A5 to either of the column drivers 26A and 26C of the first and the third blocks 20A and 20C. The first common column decoder 50AC also supplies column drive enable signals CDE0 and CDE2 respectively to the first and the third column drivers 26A and 26C, while supplying a preamplifier enable signal EPAE and a write buffer enable signal EWBE to the first common preamplifier/write driver 28AC.

In a similar manner, the second common column decoder 50BD decodes the column address A0 through A5 and supplies a bit line selection signal corresponding to the decoded column address to either of the column drivers 26B and 26D of the second and the fourth blocks 20B and 20D. The second common column decoder 50BD also supplies column drive enable signals CDE1 and CDE3 respectively to the second and the fourth column drivers 26B and 26D, while supplying a preamplifier enable signal OPAE and a write buffer enable signal OWBE to the second common preamplifier/write driver 28BD.

The first through the fourth column drivers 26A through 26D respectively select a bit line pair corresponding to the supplied bit line selection signal, in response to the column drive enable signals CDE0 through CDE3. The details of the common column decoders and the column drivers will be discussed later.

Data is read from the memory cell, which is specified by the word line activated by the column driver and the bit line pair selected by the column driver in the selected block, via the common preamplifier/write driver 28AC or 28BD and the data input-output buffer 10. Alternatively data is read into the specified memory cell.

The details of the common column decoders and the common preamplifier/write drivers will be discussed later.

C. General Layout in Memory Chip

Figure 5:
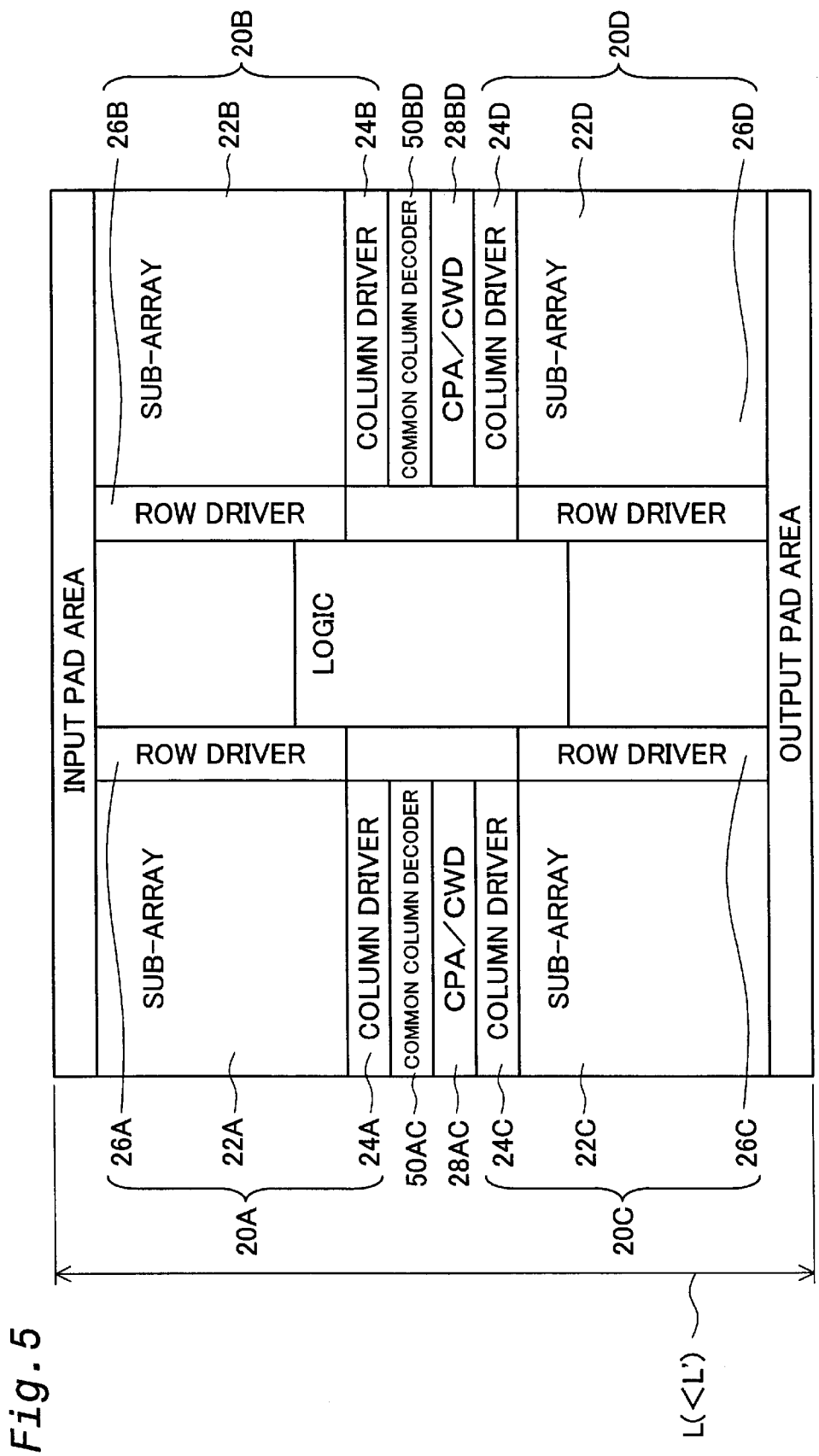
FIG. 5 schematically illustrates a layout of multiple circuit areas in the memory chip 200.

FIG. 5 schematically illustrates a layout of multiple circuit areas in the memory chip 200. Among the four blocks 20A through 20D, the first block 20A and the third block 20C are located in a left area of the memory chip 200, and the second block 20B and the fourth block 20D are located in a right area.

Between the first and the third blocks 20A and 20C disposed in the left area, the first block 20A is located in an upper area, and the third block 20C is located in a lower area. The first column driver 24A is arranged on a lower end of the first block 20A, and the first sub-array 22A is arranged above the first column driver 24A. The row driver 26A is disposed on the right side of the first sub-array 22A. The first sub-array 22A is oriented in such a manner that an aligning direction of rows (that is, a direction parallel to the columns) is set to the vertical axis of the drawing and an aligning direction of columns (that is, a direction parallel to the rows) is set to the horizontal axis of the drawing.

The layout of the third block 20C is vertically symmetrical to the layout of the first block. Namely the third column driver 24C is arranged on an upper end of the third block 20C, and the third sub-array 22C is arranged below the third column driver 24C. The row driver 26C is disposed on the right side of the third sub-array 22C.

The first common column decoder 50AC and the first common preamplifier/write driver 28AC are arranged in an intermediate area between the first block 20A and the third block 20C to be adjacent to each other in the vertical direction.

The right area has a similar layout to that of the left area, where the second block 20B is located in an upper area and the fourth block 20D is located in a lower area. The second common column decoder 50BD and the second common preamplifier/write driver 28BD are arranged in an intermediate area between the second block 20B and the fourth block 20D to be adjacent to each other in the vertical direction.

A variety of other circuits are disposed in a central logic area.

Although the common column decoders 50AC and 50BD are located above the common preamplifier/write drivers 28AC and 28BD in the drawing of FIG. 5, the arrangement may be upside down.

Figure 6:
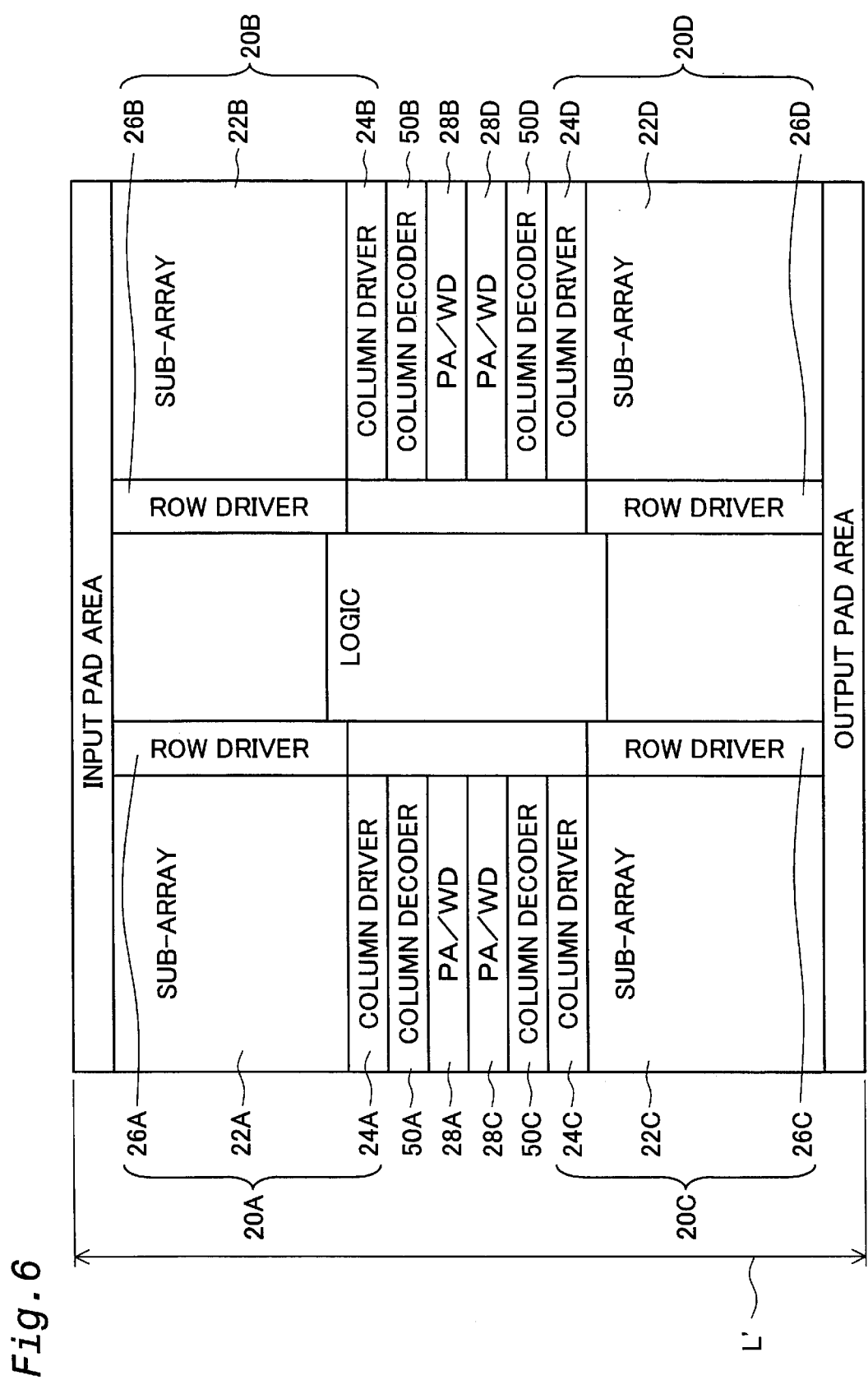
FIG. 6 schematically illustrates a layout of a comparative example.

FIG. 6 schematically illustrates a layout of a comparative example. In the layout of this comparative example, neither the column decoders nor the preamplifier/write drivers are shared, but column decoders 50A through 50D and preamplifier/write drivers 28A through 28D are respectively provided for the four blocks 20A through 20D. In the comparative example of FIG. 6, the column drivers and the preamplifier/write drivers of the two blocks aligned in the vertical direction are arranged between the two blocks to be adjacent to each other in the vertical direction.

In the layout of the embodiment shown in FIG. 5, one set of the common column decoder and the common preamplifier/write driver are disposed between the two blocks aligned in the vertical direction. In the layout of the comparative example shown in FIG. 6, on the other hand, two sets of the column decoders and the pre-amplifier/write drivers are disposed between the two blocks aligned in the vertical direction. A vertical dimension L of the chip of the embodiment is accordingly smaller than a vertical dimension L' of the chip of the comparative example. The arrangement in the memory chip 200 of the embodiment thus preferably attains chip size reduction.

In the case where the first common column decoder 50AC and the first common preamplifier/write driver 28AC are not disposed between the two blocks 20A and 20C but are located on either an upper end or a lower end of the two blocks, there is a relatively large difference between the length of a connection line of the common column decoder 50AC and the common preamplifier/write driver 28AC with the first block 20A and the length of a connection line of the common column decoder 50AC and the common preamplifier/write driver 28AC with the third block 20C. In the layout of the embodiment, however, the first common column decoder 50AC and the first common preamplifier/write driver 28AC are disposed between the two blocks 20A and 20C. The column driver 26A of the first block 20A and the column driver 26C of the third block 20C are respectively located on the lower end and the upper end of the corresponding blocks close to the common column decoder 50AC. Compared with the structure where the common column decoder 50AC and the common preamplifier/write driver 28AC are located on either the upper end or the lower end of the two blocks, there is a significantly smaller difference between the length of the connection line of the common column decoder 50AC and the common preamplifier/write driver 28AC with the column driver 26A of first block 20A and the length of the connection line of the common column decoder 50AC and the common preamplifier/write driver 28AC with the column driver 26C of the third block 20C.

In a similar manner, the second common column decoder 50BD and the second common preamplifier/write driver 28BD are arranged between the two blocks 20B and 20D. Compared with the structure where the common column decoder 50BD and the common preamplifier/write driver 28BD are located on either the upper end or the lower end of the two blocks, there is a significantly smaller difference between the length of a connection line of the common column decoder 50BD and the common preamplifier/write driver 28BD with the column driver 26B of the second block 20B and the length of a connection line of the common column decoder 50BD and the common preamplifier/write driver 28BD with the column driver 26D of the fourth block 20D. Such arrangement desirably prevents deterioration of the operating performance, due to a signal delay according to the varied length of the connection line.

D. Structure of Common Column Decoder

Figure 7:
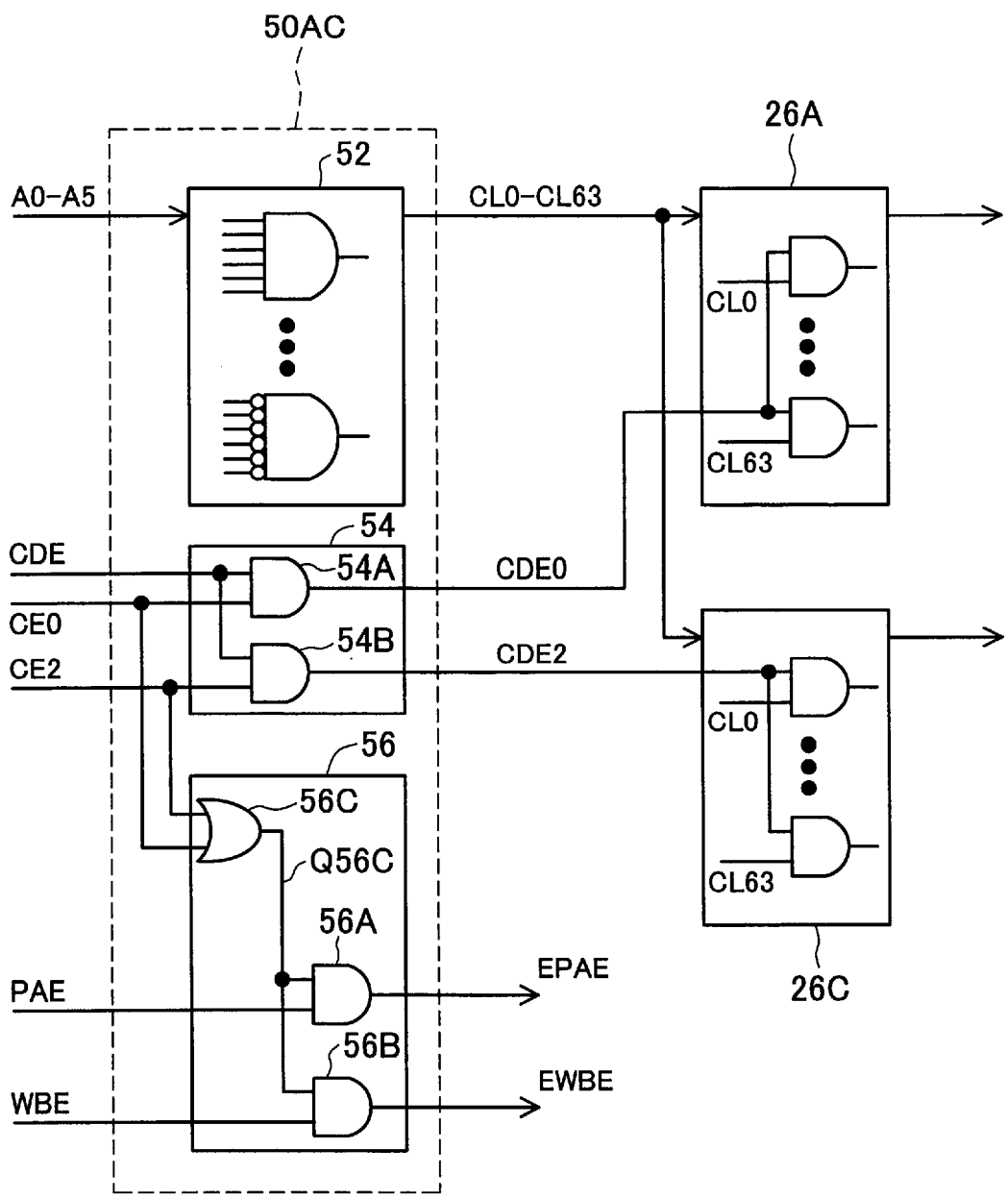
FIG. 7 is a block diagram showing the structure of a first common column decoder 50AC.

FIG. 7 is a block diagram illustrating the structure of the first common column decoder 50AC. The common column decoder 50AC has a column address decode circuit (column address decoding module) 52, a column drive enable signal generation circuit (column drive enable signal generation module) 54, and a preamplifier/write driver control circuit 56.

The column address decode circuit 52 supplies bit line selection signals CL0 through CL63 converted in response to the column address A0 through A5 to the first column driver 26A and the third column driver 26C.

The column drive enable signal generation circuit 54 has two AND gates 54A and 54B. The first AND gate 54A receives input of the column decode enable signal CDE supplied from the column controller 80 and the first column access enable signal CE0 supplied from the first block controller 40A. A first column drive enable signal CDE0 output from the first AND gate 54A is set at the level L (inactive) in response to the level L (inactive) of the first column access enable signal CE0, while being set at the same level of the column decode enable signal CDE in response to the level H (active) of the first column access enable signal CE0. Namely when the first column access enable signal CE0 is set at the level H (active), the column decode enable signal CDE is output as the first column drive enable signal CDE0. The first column drive enable signal CDE0 enables the first column driver 26A. The operations of the first column driver 26A are enabled when the first column access enable signal CE0 gives permission for column access of the first block 20A and the column decode enable signal CDE gives permission for column decoding.

The second AND gate 54B receives input of the column decode enable signal CDE and the third column access enable signal CE2 supplied from the third block controller 40C. Like the first column drive enable signal CDE0, a third column drive enable signal CDE2 is controlled according to the third column access enable signal cE2. The third column drive enable signal CDE2 enables the third column drive 26C.

The first column driver 26A has a plurality of drive circuits corresponding to the multiple bit line pairs provided in the sub-array 22A. Each drive circuit has an AND gate and receives one of the bit line selection signals CL0 through CL63 allocated to the corresponding bit line pairs and the column drive enable signal CDE0. Each drive circuit is controlled according to the first column drive enable signal CDE0. The output of each drive circuit is set inactive (at the level L) in response to the level L (inactive) of the first column drive enable signal CDE0, regardless of the level of the input bit line selection signal CL0 through CL63, while being set at the same level as the input bit line selection signal CL0 through CL63 in response to the level H (active) of the first column drive enable signal CDE0.

The third column driver 26C has a similar structure to that of the first column driver 26A and is controlled according to the third column drive enable signal CDE2.

The preamplifier/write driver control circuit 56 has two AND gates 56A and 56B and one OR gate 56C. The first AND gate 54A receives an OR signal Q56C of the two column access enable signals CE0 and CE2 output from the OR gate 56C and the preamplifier enable signal PAE. The second AND gate 54A receives the OR signal Q56C and the write buffer enable signal WBE. The first AND gate 56A outputs a first common preamplifier enable signal EPAE supplied to the first common preamplifier/write driver 28AC. The second AND gate 56B outputs a first common write buffer enable signal EWBE supplied to the first common preamplifier/write driver 28AC. When both of the two column access enable signals CE0 and CE2 are at the level L (inactive), the first common preamplifier enable signal EPAE and the common write buffer enable signal EWBE are set at the level L (inactive). When either one of the two column access enable signals CE0 and CE2 is at the level H (active), the preamplifier enable signal PAE and the write buffer enable signal WBE are output as the first common preamplifier enable signal EPAE and the first common write buffer enable signal EWBE.

The operations of the preamplifier incorporated in the first common preamplifier/write driver 28AC described later are controlled by the first common preamplifier enable signal EPAE. The operations of the write driver incorporated in the first common preamplifier/write driver 28AC are controlled by the first common write buffer enable signal EWBE.

As described above, the first common column decoder 50AC controls the operations of the column driver 26A of the first block 20A and the column driver 26C of the third block 20C according to the levels of the corresponding column drive enable signals CDE0 and CDE2. The first and the third blocks 20A and 20C accordingly share the column address decode circuit 52, which generates the bit line selection signals CL0 through CL63 in response to the column address A0 through A5.

The column drivers 26B and 26D of the second and the fourth blocks 20B and 20D and the second common column decoder 50BD connecting thereto have similar construction to that of the column drivers 26A and 26C of the first and the third blocks 20A and 20C and the first common column decoder 50AC connecting thereto.

E. Structure of Common Preamplifier/Write Driver

Figure 8:
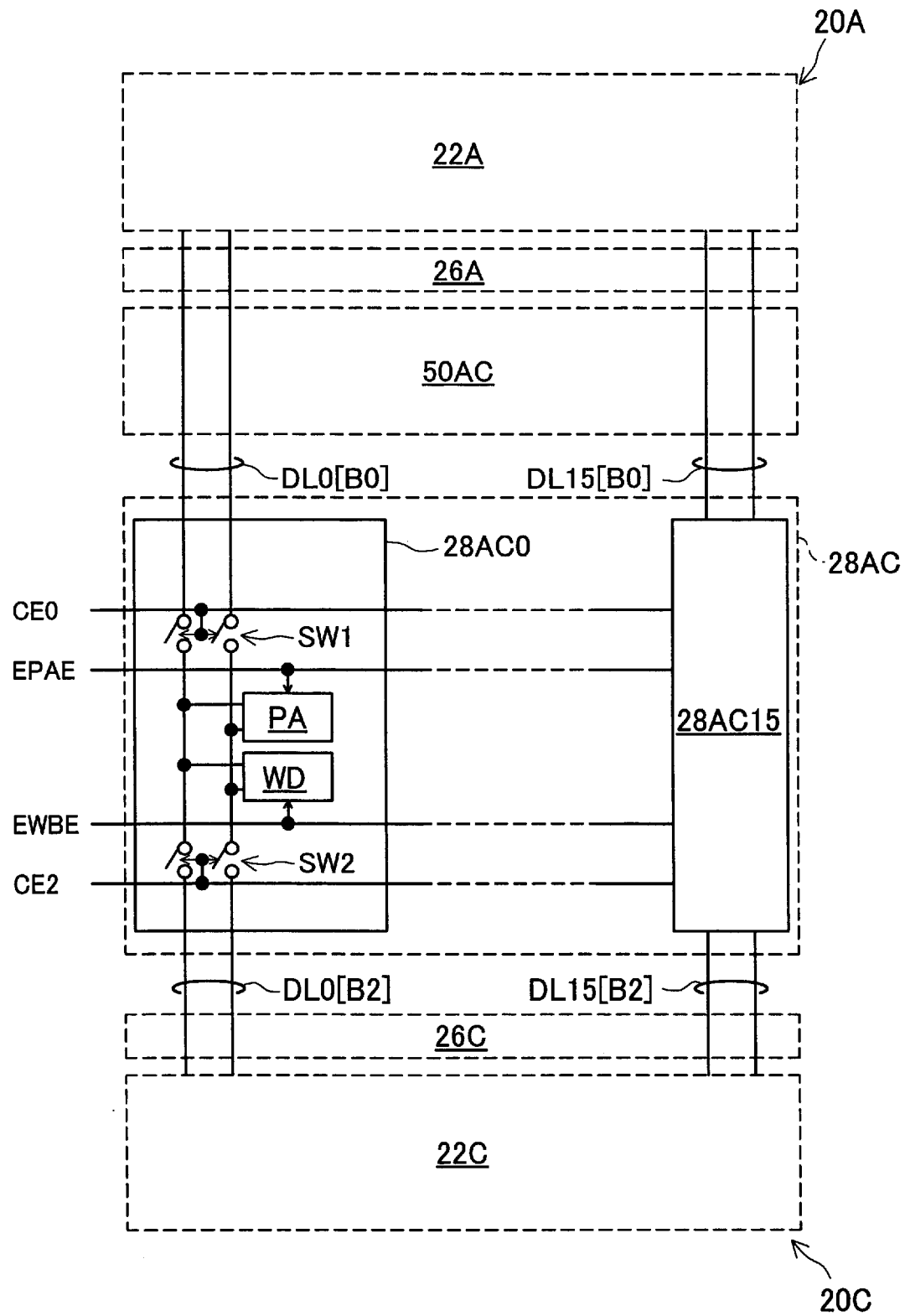
FIG. 8 is a block diagram showing the structure of a first common preamplifier/write driver 28AC.

FIG. 8 is a block diagram illustrating the structure of the first common preamplifier/write driver 28AC. This common preamplifier/write driver 28AC has sixteen common preamplifier/write driver circuits 28AC0 through 28AC15. These common preamplifier/write driver circuits 28AC0 through 28AC15 are connected to the sub-array 22A of the first block 20A via sixteen bit line pairs DL0[B0] through DL15[B0]. The common preamplifier/write driver circuits 28AC0 through 28AC15 are also connected to the sub-array 22C of the third block 20C via sixteen bit line pairs DL0[B2] through DL15[B2]. Sixteen bit line pairs selected among the multiple bit line pairs in the first sub-array 22A by the first driver 26A are connected to the bit line pairs DL0[B0] through DL15[B0] of the first group. Sixteen bit line pairs selected among the multiple bit line pairs in the third sub-array 22C by the third driver 26C are connected to the bit line pairs DL0[B2] through DL15[B2] of the second group. The sixteen common preamplifier/write driver circuits 28AC0 through 28AC15 have substantially an identical structure.

The first common preamplifier/write driver circuit 28AC0 has a preamplifier circuit PA and a write driver circuit WD. Inputs of the preamplifier circuit PA and the write driver circuit WD are mutually connected in parallel, and are given to the first bit line pair DL0[B0] of the first block 20A via a first separation switch SW1 while being given to the first data line pair DL0[B2] of the third block 20C via a second separation switch SW2.

The first separation switch SW1 is set in ON position or in OFF position in response to the first column access enable signal CE0, whereas the third separation switch SW2 is set in ON position or in OFF position in response to the third column access enable signal CE2. The first column access enable signal CE0 is set active when the value of the block address A6 and A7 is equal to '0' and external access to the first block 20A is required. The third column access enable signal CE2 is set active, on the other hand, when the value of the block address A6 and A7 is equal to '2' and external access to the third block 20A is required. Namely when the first column access enable signal CE0 is active and the third column access enable signal CE2 is inactive, the first separation switch SW1 is set in ON position and the second separation switch SW2 is set in OFF position. The bit line pair DL0[B0] of the first block 20A or the block 0 is then connected to the preamplifier PA and the write driver WD.

When the first column access enable signal CE0 is inactive and the third column access enable signal CE2 is active, the first separation switch SW1 is set in OFF position and the second separation switch SW2 is set in ON position. The bit line pair DL0[B2] of the third block 20C is then connected to the preamplifier PA and the write driver WD.

When both of the first column access enable signal CE0 and the third column access enable signal CE2 are inactive, both the first separation switch SW1 and the second separation switch SW2 are set in OFF position. Both of the bit line pair DL0[B0] and the bit line pair DL0[B2] are then disconnected from the preamplifier PA and the write driver WD.

As described above, the first block 20A and the third block 20C share the first common preamplifier/write driver circuit 28AC.

Like the first common preamplifier/write driver 28AC, the second common preamplifier/write driver 28BD is shared by the second block 20B and the fourth block 20D. The block connected to the common preamplifier/write driver 28BD is selected in response to the second column access enable signal CE1 and the fourth column access enable signal CE3. The second column access enable signal CE1 is set active when the value of the block address A6 and A7 is equal to '1' and external access to the second block 20B is required. The fourth column access enable signal CE3 is set active when the value of the block address A6 and A7 is equal to '3' and external access to the fourth block 20D is required.

F. Modifications

The above embodiment and its modifications are to be considered in all aspects as illustrative and not restrictive. There may be many modifications, changes, and alterations without departing from the scope or spirit of the main characteristics of the present invention. Some examples of possible modification are given below.

(1) In the memory chip 200 of the embodiment discussed above, the two blocks share both of the column decoder and the preamplifier/write driver. The two blocks may alternatively share either one of the column decoder and the preamplifier/write driver. Such modified arrangement also attains size reduction of the semiconductor chip.

(2) The memory chip 200 of the embodiment is the virtual SRAM having the memory cell array 20 divided into the four blocks 20A through 20D. This is, however, not restrictive. The memory chip 200 may be any semiconductor memory device having a memory cell array divided into multiple blocks. Every two blocks among the multiple blocks are specified as one group to share the column decoder and the preamplifier/write driver. The common column decoder and the common preamplifier/write driver are interposed between the two blocks. This arrangement desirably attains chip size reduction of the semiconductor memory device.

The number of blocks may be an odd number, although an even number is preferable. This is because one block can not share the column decoder and the preamplifier/write driver in the case of odd blocks.

The principle of the present invention is applied to the virtual SRAM in the memory chip 200 of the embodiment. This is, however, not restrictive. The present invention is applicable to a diversity of semiconductor memory devices, such as a DRAM and an SRAM, having a memory cell array divided into multiple blocks.

What is claimed is:

1. A semiconductor memory device, comprising:

a first memory cell block and a second memory cell block, in each of which memory cells are arranged in a matrix; and a common preamplifier/write driver shared by the first memory cell block and the second memory cell block, wherein the first memory cell block and the second memory cell block are aligned in a direction parallel to columns of the memory cells, and the common preamplifier/write driver is located between the first memory cell block and the second memory cell block, a common column address decoder shared by the first memory cell block and the second memory cell block, wherein the common column address decoder is located adjacent to the common preamplifier/write driver between the first memory cell block and the second memory cell block and, wherein the first memory cell block and the second memory cell block respectively have a first column driver and a second column driver disposed on either side of the common column address decoder, and the common column address decoder comprises:

a column address decoding module that supplies a set of column selection signals, which are converted corresponding to an input column address, commonly to the first column driver and the second column driver; and a column drive enable signal generation module that supplies a first column drive enable signal and a second column drive enable signal respectively to the first column driver and the second column driver, in order to enable operations of the first column driver and the second column driver.

2. A semiconductor memory device, comprising:

a first memory cell block and a second memory cell block, in each of which memory cells are arranged in a matrix; and a common column address decoder shared by the first memory cell block and the second memory cell block, wherein the first memory cell block and the second memory cell block are aligned in a direction parallel to columns of the memory cell, and the common column address decoder is located between the first memory cell block and the second memory cell block, wherein the first memory cell block and the second memory cell block respectively have a first column driver and a second column driver disposed on either side of the common column address decoder, and the common column address decoder comprises:

a column address decoding module that supplies a set of column selection signals, which are converted corresponding to an input column address, commonly to the first column driver and the second column driver; and a column drive enable signal generation module that supplies a first column drive enable signal and a second column drive enable signal respectively to the first column driver and the second column driver, in order to enable operations of the first column driver and the second column driver.

* * * * *